(12) United States Patent
Basham et al.

(10) Patent No.: US 7,966,723 B2
(45) Date of Patent: Jun. 28, 2011

(54) METHOD FOR FACILITATING ACCESS TO ELECTRONIC COMPONENTS

(75) Inventors: Robert B. Basham, Aloha, OR (US); Shah Mohammad Rezaul Islam, Tucson, AZ (US); Gregg S. Lucas, Tucson, AZ (US); Kenneth R. Schneebeli, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 560 days.

(21) Appl. No.: 12/113,457

(22) Filed: May 1, 2008

(65) Prior Publication Data
US 2008/0212290 A1 Sep. 4, 2008

Related U.S. Application Data

(63) Continuation of application No. 11/427,077, filed on Jun. 28, 2006, now Pat. No. 7,375,961.

(51) Int. Cl.
*H01R 43/00* (2006.01)
(52) U.S. Cl. ............................. 29/854; 29/592.1; 29/825
(58) Field of Classification Search .................. 29/592.1, 29/825, 854
See application file for complete search history.

(56) References Cited

U.S. PATENT DOCUMENTS

| | | | |
|---|---|---|---|
| 4,247,980 A * | 2/1981 | Tominoi | 29/742 |
| 4,805,110 A * | 2/1989 | Takahashi et al. | 700/121 |
| 5,084,962 A * | 2/1992 | Takahashi et al. | 29/833 |
| 5,258,679 A | 11/1993 | Gassmann | |
| 6,594,150 B2 | 7/2003 | Creason et al. | |
| 6,869,314 B2 | 3/2005 | Garnett et al. | |
| 6,934,150 B2 | 8/2005 | Kitchen et al. | |
| 6,940,405 B2 | 9/2005 | Script et al. | |
| 6,944,019 B2 | 9/2005 | King et al. | |
| 6,952,659 B2 | 10/2005 | King et al. | |
| 2003/0105859 A1 | 6/2003 | Garnett et al. | |
| 2004/0078711 A1 | 4/2004 | King et al. | |
| 2005/0021606 A1 | 1/2005 | Davies et al. | |
| 2007/0026694 A1 | 2/2007 | Mayer | |
| 2007/0135157 A1 | 6/2007 | Kuo et al. | |

OTHER PUBLICATIONS

"SFF-8482 Specification for Unshielded Dual Port Serial Attachment Connector", Rev. 2.2, SFF Committee, Feb. 1, 2006 (pp. 1-19).

* cited by examiner

*Primary Examiner* — C. J Arbes
(74) *Attorney, Agent, or Firm* — Steven L. Bennett, Esq.; Kevin P. Radigan, Esq.; Heslin Rothenberg Farley & Mesiti PC

(57) ABSTRACT

An electronics component support assembly and an electronics system assembly employing the component support assembly are provided. The component support assembly includes a rotatable base support and a component connector assembly. The rotatable base support is sized to reside within an electronics enclosure and to operatively support multiple electronics components thereon. The component connector assembly is associated with the rotatable base support, and at least some electronics components of the multiple electronics components couple thereto when operatively supported by the rotatable base support. Rotation of the rotatable base support facilitates access to the multiple electronics components, and the component connector assembly allows for rotation of the rotatable base support with the multiple electronics components operatively supported on the rotatable base support.

6 Claims, 8 Drawing Sheets

1

METHOD FOR FACILITATING ACCESS TO ELECTRONIC COMPONENTS

CROSS-REFERENCE TO RELATED APPLICATIONS

This application is a continuation of U.S. patent application Ser. No. 11/427,077, filed Jun. 28, 2006, entitled "Rotatable Component Support Assembly For An Electronics Enclosure," the entirety of which is hereby incorporated herein by reference.

TECHNICAL FIELD

The present invention relates in general to computer systems, and more particularly, to a rotatable electronics component support assembly for an electronics enclosure, such as a computer system or subsystem enclosure.

BACKGROUND OF THE INVENTION

Two standard form factors employed by many large computer systems today are a multi-blade system and a multi-drawer electronics rack system. In a multi-blade system, multiple blades (each containing for example, multiple electronics components such as processor modules, memory, and power and hard drive devices) are operatively positioned within a blade chassis, with individual blades being removable and replaceable in the field without affecting operation of the remaining blades. Similarly, in a rack mount environment, one or more electronics drawers of the electronics rack may be removed and/or replaced in the field without affecting operation of the remaining electronics drawers.

One restriction on the blade center and electronics rack configurations is that the entire blade or drawer must be operatively disengaged and removed in order to, for example, replace a particular component within the blade or drawer.

SUMMARY OF THE INVENTION

Field replacing a field replaceable component in a three-dimensional electronics enclosure, such as a hot-pluggable blade or hot-pluggable electronics drawer, while maintaining operation of the electronics system is a challenge. One possible solution is to mount smaller electronics components to cards mounted around the edge of the blade or drawer for external access thereto. However, this solution provides a user with no recourse if there are more field replaceable components within an electronics enclosure than can be packaged on the accessible edge of the enclosure. This is particularly a challenge when designing for an electronics blade or drawer where only the face surface of the blade or drawer is externally accessible since the blade center chassis or electronics rack conventionally provides no access from the top, bottom or sides of the enclosure. Thus, further solutions to this limitation are needed and are disclosed herein.

Briefly summarized, the present invention comprises in one aspect a component support assembly for an electronics enclosure. The component support assembly includes a rotatable base support and a component connector assembly. The rotatable base support is sized to reside within the electronics enclosure and operatively support multiple electronics components thereon. The component connector assembly is associated with the rotatable base support, and allows at least some electronics components of the multiple electronics components to couple thereto in operative position on the rotatable base support. Rotation of the rotatable base support facilitates access to each of the at least some electronics components, and the component connector assembly is configured to allow for rotation of the rotatable base support with the multiple electronics components operatively supported thereon.

In an enhanced aspect, the rotatable base support includes a base member configured to support the multiple electronics components thereon and a rotation support mechanism. The rotation support mechanism couples the base member to the electronics enclosure, and allows for rotation of the base member while the multiple electronics components are supported by the base member in operative position. In another aspect, the electronics enclosure is an electronics subsystem enclosure insertable in a docked operative position within an electronics housing employing an electronics interface including a subsystem connector assembly. The component support assembly further includes at least one flexible cable connecting the subsystem connector assembly and the component connector assembly. The at least one flexible cable is of sufficient length to allow rotation of the rotatable base support to facilitate access to each of the at least some electronics components without removing the electronics subsystem enclosure from the docked operative position within the electronics housing. In one embodiment, the electronics subsystem enclosure further includes an access surface with an access opening therein for accessing the at least some electronics components of the multiple electronics components supported by the rotatable base support without removing the electronics subsystem enclosure from docked operative position within the electronics housing.

In a further embodiment, each electronics component of the multiple electronics components couples to the component connector assembly when in an operative position on the rotatable base support, and the rotatable base support facilitates access through the access opening to each electronics component of the multiple electronics components supported by the rotatable base support and coupled to the component connector assembly in operative position.

In a still further aspect, the electronics housing is, in one example, a blade chassis and the electronics subsystem enclosure is a blade insertable in the blade chassis in the docked operative position employing the electronics interface, wherein the electronics interface comprises a hot-pluggable subsystem connector assembly. In an alternate implementation, the electronics housing is an electronics rack and the electronics subsystem enclosure is an electronics drawer insertable in the electronics rack in the docked operative position employing the electronics interface, wherein the electronics interface includes a hot-pluggable subsystem connector assembly.

In another embodiment, the component connector assembly resides on the rotatable base support, and couples to an electronics interface of the electronics enclosure via at least one flexible cable. The at least one flexible cable is sized to allow rotation of the rotatable base support at least 90°, and in certain embodiments, 180° or 360° or more. Further, the rotatable base support, in one embodiment, includes a base member configured to support the multiple electronics components thereon and a rotation support mechanism coupling the base member to the electronics enclosure. The rotation support mechanism allows for rotation of the base member while the multiple electronics components are supported by the base member in operative position. The at least one flexible cable extends at least partially between the base member and the electronics enclosure around the rotation support mechanism.

By way of example, the at least some electronics components of the multiple electronics components are disposed in a planar array on the rotatable base support. Alternatively, each electronics component of the at least some electronics components is disposed on edge on the rotatable base support when disposed in operative position thereon and coupled to the component connector assembly.

In another embodiment, the component support assembly is combined with the electronics enclosure, and the electronics enclosure includes an access surface having an access opening. The component support assembly is positioned to provide access to each electronics component of the multiple electronics components operatively supported on the rotatable base support through the access opening in the access surface of the electronics enclosure. As a specific example, the at least some electronics components are hard disk drives.

In a further embodiment, the rotatable base support is a first rotatable base support, and the electronics component assembly includes at least one additional rotatable base support. The at least one additional rotatable base support is rotatably coupled to the first rotatable base support to rotate relative to the first rotatable base support and turn with rotation of the first rotatable base support. The at least one additional rotatable base support operatively supports at least one electronics component thereon of the multiple electronics components, and facilitates access to the at least one electronics component disposed thereon.

In another aspect, a component support assembly for an electronics enclosure is provided. This component support assembly includes a first rotatable base support and at least one second rotatable base support. The first rotatable base support is sized to reside within the electronics enclosure and to operatively support multiple electronics components thereon, while the at least one second rotatable base support rotatably couples to the first rotatable base support to rotate relative to the first rotatable base support and turn with rotation of the first rotatable base support. Further, the at least one second rotatable base support is sized to reside on the first rotatable base support and to support at least some electronics components of the multiple electronics components. Rotation of at least one of the first rotatable base support and the second rotatable base support facilitates access to the multiple electronics components operatively supported thereon.

In another aspect, an electronics system assembly is provided which includes an electronics housing and a plurality of electronics subsystem enclosures. Each electronic subsystem enclosure of the plurality of electronics subsystem enclosures is insertable into the electronics housing in a docked operative position. At least one electronics subsystem enclosure of the plurality of electronics subsystem enclosures includes a component support assembly. The component support assembly includes a rotatable base support and a component connector assembly. The rotatable base support is sized to reside within the at least one electronics enclosure and to operatively support multiple electronics components thereon. The component connector assembly, which is associated with the rotatable base support, allows at least some electronics components of the multiple electronics components to couple thereto when in operative position on the rotatable base support. Rotation of the rotatable base support facilitates access to each of the at least some electronics components of the multiple electronics components, and the component connector assembly is configured to allow for rotation of the rotatable base support with the multiple electronics components operatively supported thereon.

In a further aspect, a method of facilitating access to electronics components within an electronics enclosure is provided. This method includes: providing a component support assembly including a rotatable base support sized to reside within the electronics enclosure, and a component connector assembly associated with the rotatable base support for operatively coupling to multiple electronics components; disposing multiple electronics components on the rotatable base support in operative position by coupling the multiple electronics components to the component connector assembly; and wherein rotation of the rotatable base support facilitates access to the multiple electronics components, and wherein the component connector assembly allows for rotation of the rotatable base support with the multiple electronics components operatively supported thereon.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Generally stated, disclosed herein are component support assemblies for electronic enclosures. As one example, the component support assembly includes a rotatable base support sized to reside within an electronics enclosure and to operatively support multiple electronics components thereon. Further, the component support assembly includes a component connector assembly which is associated with the rotatable base support. At least some electronics components of the multiple electronics components couple to the component connector assembly when supported in operative position by the rotatable base support. Rotation of the rotatable base support facilitates access to the electronics components through a single access surface of the electronics enclosure, and the component connector assembly is configured to allow for rotation of the rotatable base support with the multiple electronics components operatively supported thereon. As a further example, the electronics enclosure is an electronics subsystem enclosure insertable in a docked operative position within an electronics housing employing an electronics interface.

As used herein, "electronics housing" includes any frame, rack, chassis, etc. designed to receive one or more electronics subsystem enclosures; and may be, for example, a stand-alone computer processor having high, mid or low end processing capabilities. In one embodiment, an electronics housing may comprise a blade system housing or chassis, while in another embodiment, an electronics housing may comprise an electronics rack. The term "electronics enclosure" broadly means any structure enclosing electronics components therein, and includes, for example, an electronics subsystem enclosure. An "electronics subsystem enclosure" is an electronics enclosure designed for docked, operative insertion into an electronics housing, and includes, for example, a blade of a multi-blade system or an electronics drawer of an electronics rack.

Figure 1A:
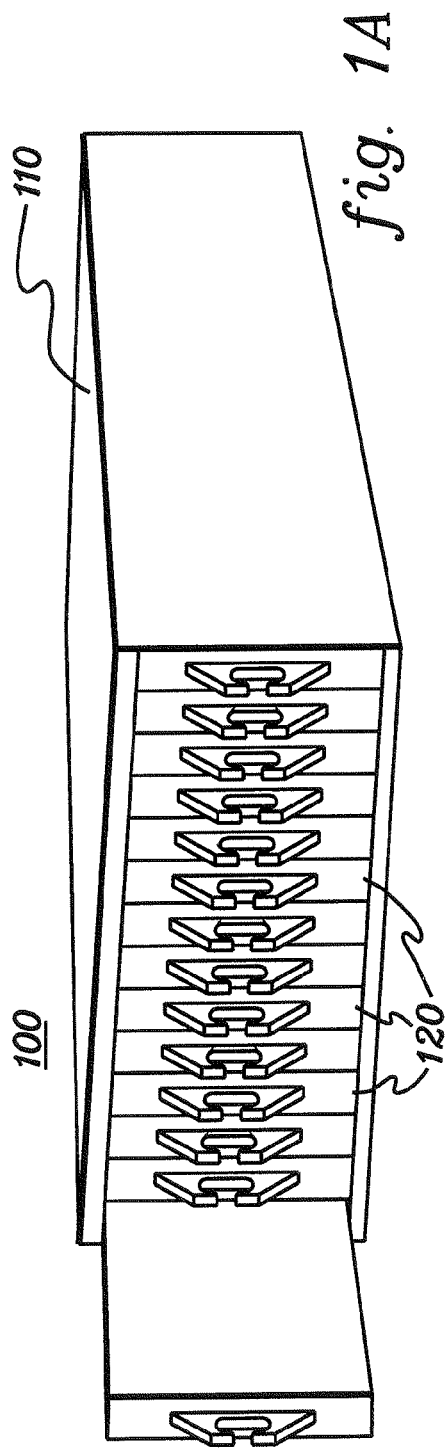
FIG. 1A depicts one embodiment of a multi-blade center system within which a component support assembly is employed, in accordance with an aspect of the present invention.
Figure 1C:
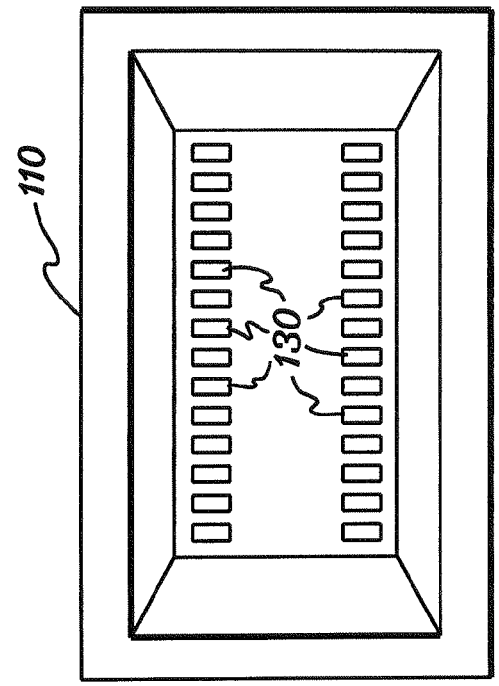
FIG. 1C is an elevational view of one embodiment of the blade center chassis or housing of the multi-blade center system of FIG. 1A, with the multiple blades of the blade center system removed therefrom.
Figure 1B:
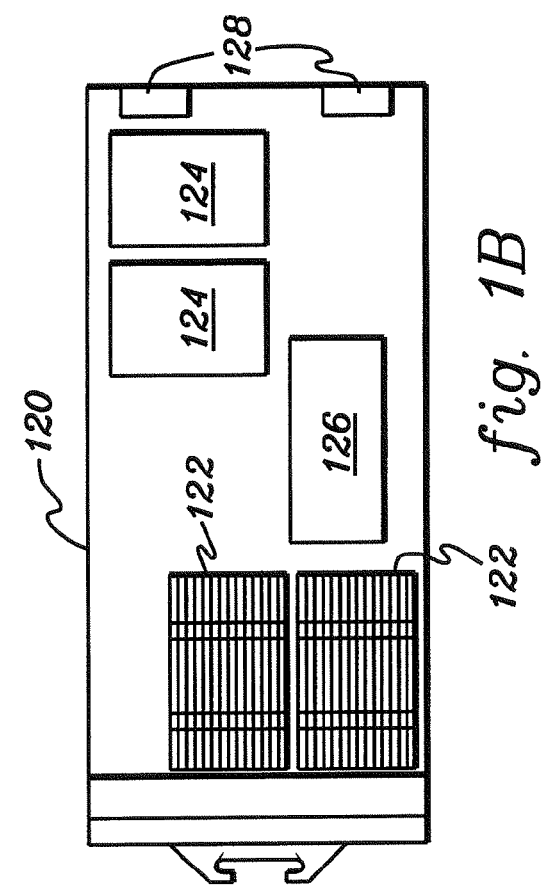
FIG. 1B is a side elevational view of one embodiment of a blade for the multi-blade center system of FIG. 1A.

By way of example, various aspects of the present invention are disclosed hereinbelow with reference to a blade system, one embodiment of which is depicted in FIGS. 1A-1C. The blade system 100 of FIG. 1A includes an electronics housing or blade chassis 110 and multiple blades 120, each being one example of an electronics subsystem enclosure, which docks in blade chassis 110 when in operative position.

FIG. 1B depicts one simplified embodiment of a blade 120. This electronics subsystem includes, by way of example, multiple processors above which reside respective air-cooled heat sinks 122. In this example, each blade is a complete computer system, and includes for example, DASD 124 and memory chips 126. Electrical connectors 128 are provided for electrically hot-plug connecting blade 120 to blade chassis 110 (FIG. 1C). As shown in FIG. 1C, corresponding electrical connectors 130 are disposed within the blade chassis for making connection to connectors 128 when the blade is electro-mechanically docked therein in operative position.

By way of specific example, International Business Machines Corporation of Armonk, N.Y., markets a Blade-Center® system such as depicted in FIGS. 1A-1C, which provides a single architecture that supports a wide selection of processor technologies and operating systems, as well as a broad range of storage and networking options integrated into a single blade chassis of a multi-blade system.

Figure 2:
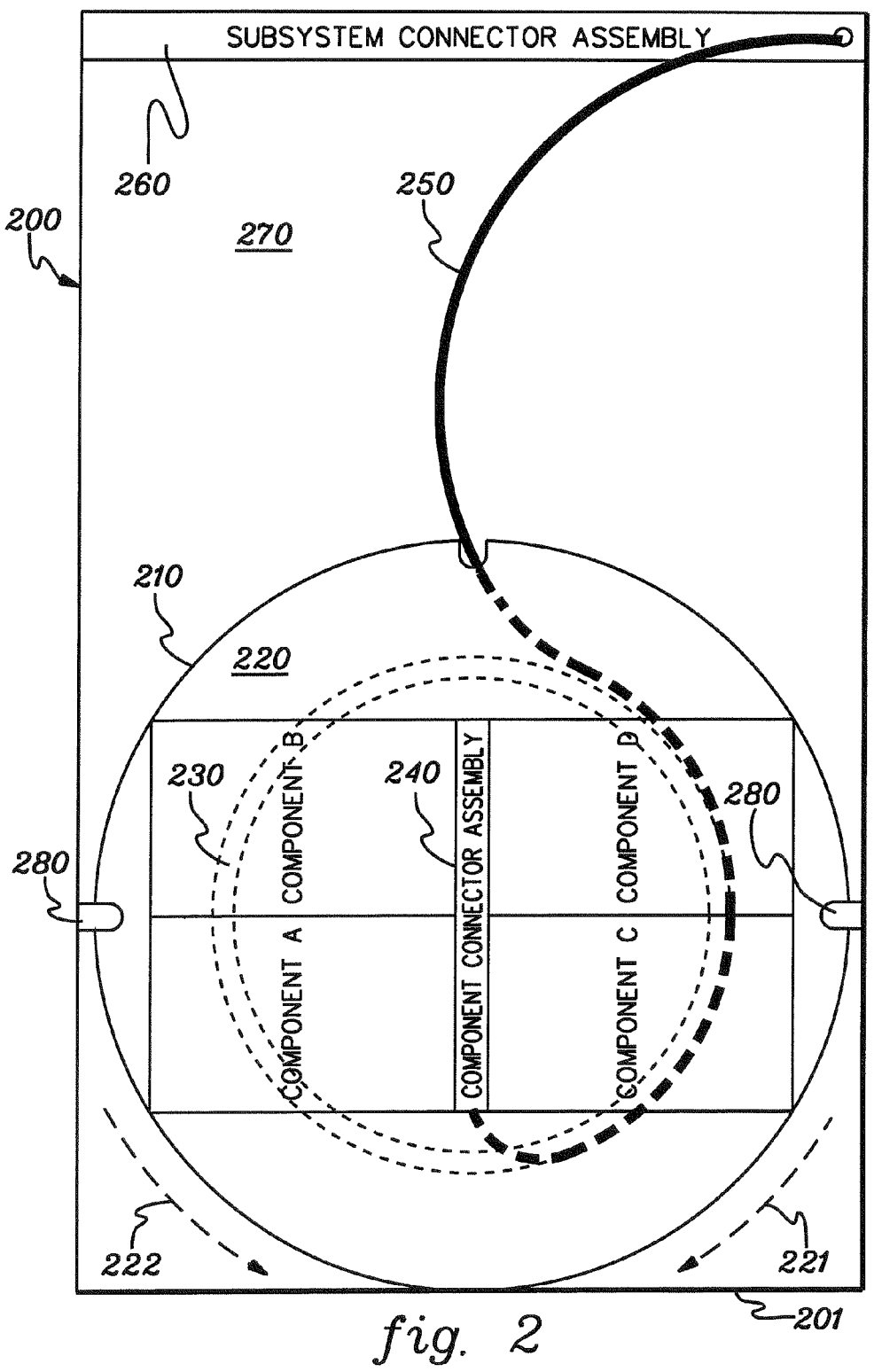
FIG. 2 is a top plan view of one embodiment of an electronics enclosure with a component support assembly, in accordance with an aspect of the present invention.

FIG. 2 is a plan view of one embodiment of an electronics subsystem enclosure, generally denoted 200, in accordance with an aspect of the present invention. Electronics subsystem enclosure 200 is, in one example, a blade for a multi-blade system such as depicted in FIGS. 1A-1C.

As shown, electronics subsystem enclosure 200 includes a rotatable base support 210 sized to reside within electronics subsystem enclosure 200. Rotatable base support 210 comprises a base member 220 and a rotation support mechanism 230 coupling base member 220 to electronics subsystem enclosure 200. By way of example, base member 220 is a circular support structure or plate having a diameter less than the smaller dimension of the rectangular footprint of electronics subsystem enclosure 200. The rotation support mechanism 230 comprises, in one example, a donut-shaped bearing support, which allows base member 220 to rotate in either direction as shown by arrows 221, 222. By way of specific example, rotation support mechanism 230 is a circular bearing support system such as the bearing system, part number 9546, offered by Shepherd Hardware Products of Three Oaks, Mich. As an alternate implementation, the rotation support mechanism comprises a bracket apparatus rotatably disposed over a central pin connected to the electronics subsystem enclosure. The bracket apparatus could include arms that are cross-braced and intersecting as an x-shaped bracket in plan view.

The component support assembly of FIG. 2 further includes a component connector assembly 240 disposed on the rotatable base support 210. The component connector assembly 240 comprises, in one example, a hot-pluggable electrical/mechanical interface assembly for multiple electronics components (e.g., components A-D arrayed in a planar fashion on base member 220 as shown). By way of specific example, components A-D are storage modules, such as SFF (small form factor) hard disk drives. One example of an SFF hard disk drive electromechanical connector interface is described in a publication entitled "SFF-8482 Specification for Unshielded Dual Port Serial Attachment Connector", Rev. 2.2, Feb. 1, 2006, published by the SFF Committee (http://www.sffcommittee.org). More generally, one skilled in the art will understand that component connector assembly 240 supports modularity, and is an electronics interface assembly configured to receive multiple electronics components, either of the same type and size and/or of any desired mix of different types and sizes of electronics components. The electronics interface assembly may include, for example, certain logic and power components, as needed for a particular implementation.

Certain components of the electronics components operatively supported by the rotatable base support 210 can be the same electronics components or different electronics components, including similarly sized or differently sized electronics components. The component connector assembly is configured with the appropriate electrical/mechanical docking connections, as will be understood by one skilled in the art, to accept each respective electronics component. Further, the electronics components are assumed to be removable and individually replaceable within the design of the electronics subsystem enclosure. Many examples of such systems exist today.

As shown in FIG. 2, component connector assembly 240 electrically connects via one or more flexible cables 250 to an electronics interface, such as a hot-pluggable subsystem connector assembly 260, for electronics subsystem enclosure 200. As shown, the one or more flexible cables 250 extend at least partially underneath base member 220 of rotatable base support 210 and, in the illustrated embodiment, wrap at least partially around rotation support mechanism 230. The one or more flexible cables 250 are provided with sufficient flexibility and length to allow for rotation of the rotatable base member 220 in either direction 221 or 222 at least 90° in this example. In other implementations, the flexible cables are of sufficient length to allow for rotation of the rotatable base member up to 180° in either direction, or even 360° or more, if desired. A cable consolidator (not shown) could be employed in coupling the one or more flexible cables to either to subsystem connector assembly or the component connector assembly. Further, a cable coiler (not shown) could be employed to hold excess cable length and manage the flexible cables as the specified extent of rotation is achieved in the desired direction. As one specific example, four flexible cables are employed to couple the four electronics components of FIG. 2 to the subsystem connector assembly, with each cable providing connection to a respective electronics component.

If desired, one or more additional components (not shown) could be disposed within space 270 of electronic subsystem enclosure 200, provided that the additional components do not interfere with movement of the one or more flexible cables 250 with rotation of the rotatable base support 210. In one embodiment, one or more latches 280 are employed to secure rotatable base support 210 in fixed position within the electronic subsystem enclosure 200 until actuated by an operator either electronically or mechanically. By way of example, a spring-biased latch could be employed with appropriate mechanical couplings to a front access surface 201 of electronic subsystem enclosure 200 to allow an operator to retract latches 280 and rotate the rotatable base support manually in either direction as desired to access a particular electronics component. One or more stop pins (not shown) may be employed to prevent over-rotation of rotatable base support 210.

Figure 3:
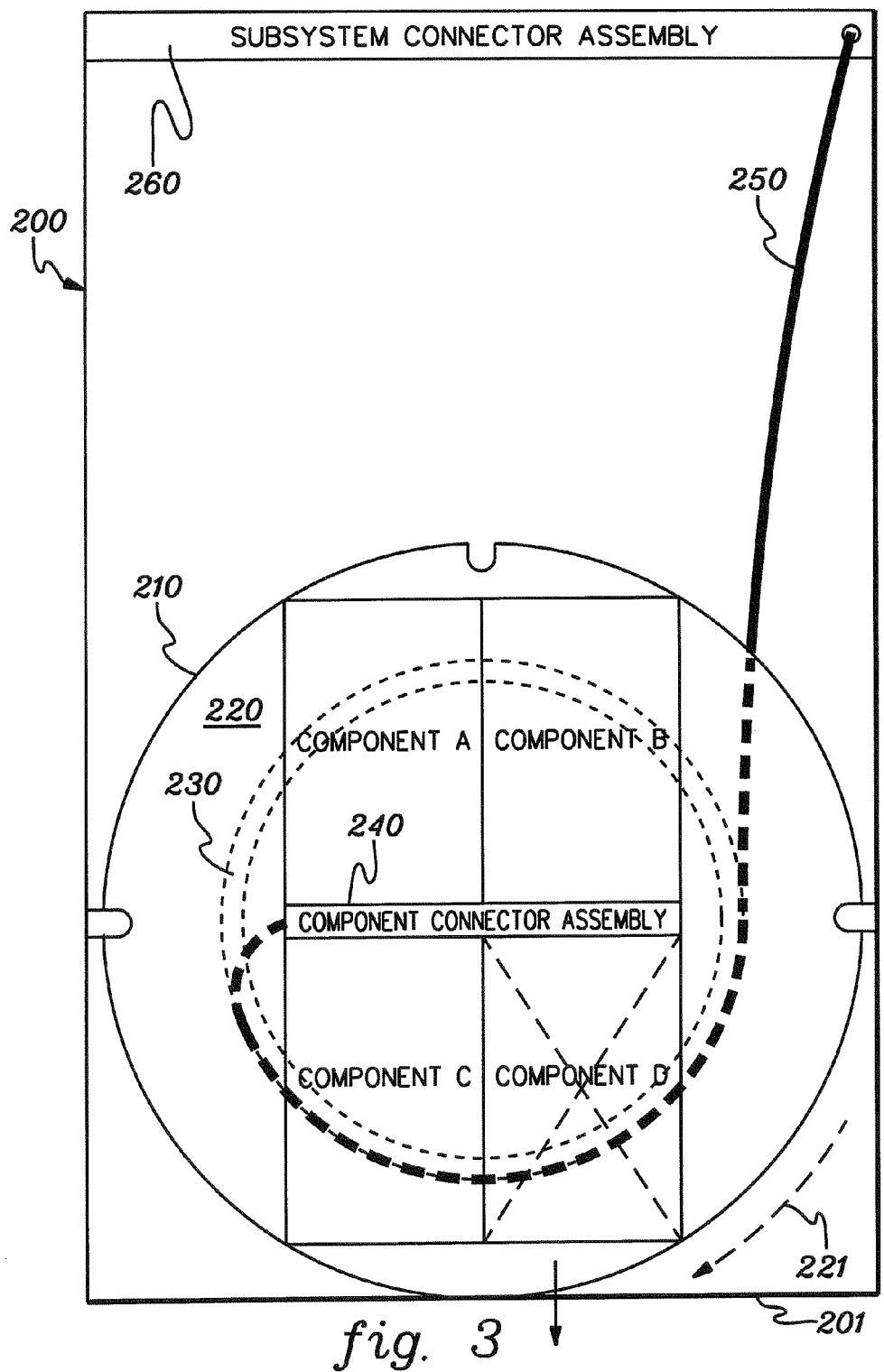
FIG. 3 is a top plan view of the electronics enclosure of FIG. 2 after rotation of the rotatable base support of the component support assembly to allow access through an access surface of the enclosure to an electronics component D disposed in operative position thereon, in accordance with an aspect of the present invention.
Figure 3A:
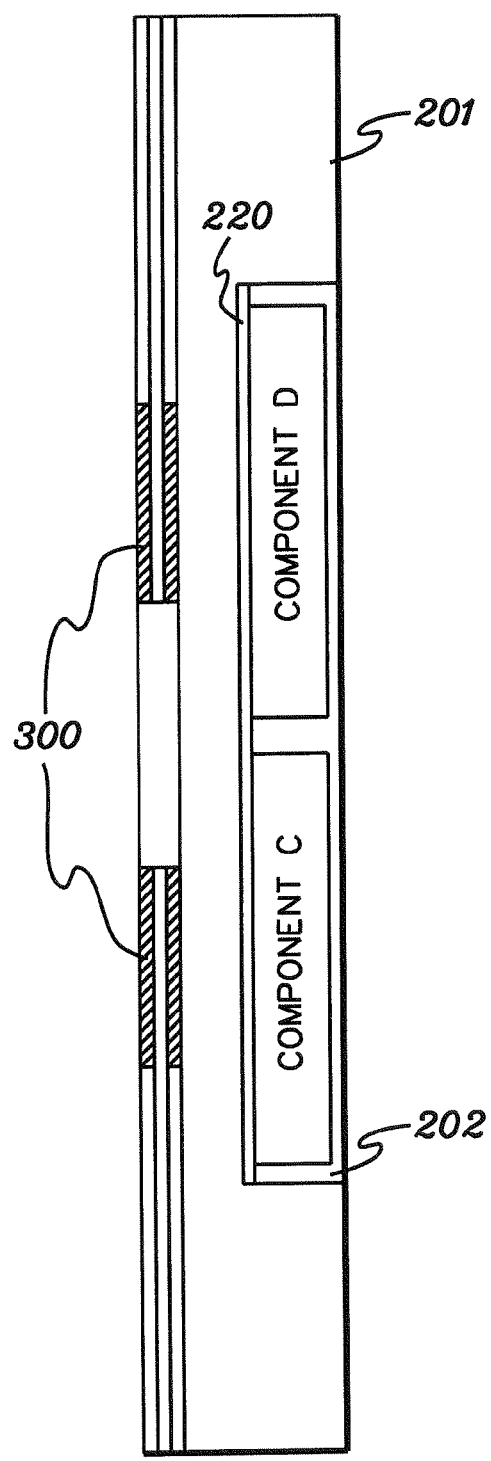
FIG. 3A is an elevational view of one embodiment of the access surface of the electronics enclosure of FIG. 3, showing external access through an access opening to component C and component D operatively disposed on the rotatable base support, in accordance with an aspect of the present invention.

FIG. 3 illustrates electronic subsystem enclosure 200 of FIG. 2, after rotation of rotatable base support 210 90° in the direction shown by arrow 221 to allow for operator access to components C & D through front access surface 201 of electronic subsystem enclosure 200. One embodiment of front access surface 201 is shown in greater detail in FIG. 3A. As shown in FIG. 3A, a leftmost edge of front access surface 201 includes a handle 300 which facilitates undocking and removal of the electronics subsystem enclosure from the electronics housing when necessary. Front access surface 201 further includes an access opening 202 therein, which is typically covered by an access door (not shown), for example, hingedly mounted to front access surface 201. With rotation of rotatable base support 210 to the orientation shown in FIG. 3, components C & D are accessible through access opening 202. Again, these components reside in operative position on base member 220 of rotatable base support 210. As noted above, each component A-D is electrically and mechanically docked in operative position in the component connector assembly 240 (see FIG. 3). In one example, the multiple electronics components are part of an electronics system which is single-actuator maintainable, i.e., a system wherein one component at a time may be removed from operation without impairing operation of the electronics system.

Figure 4:
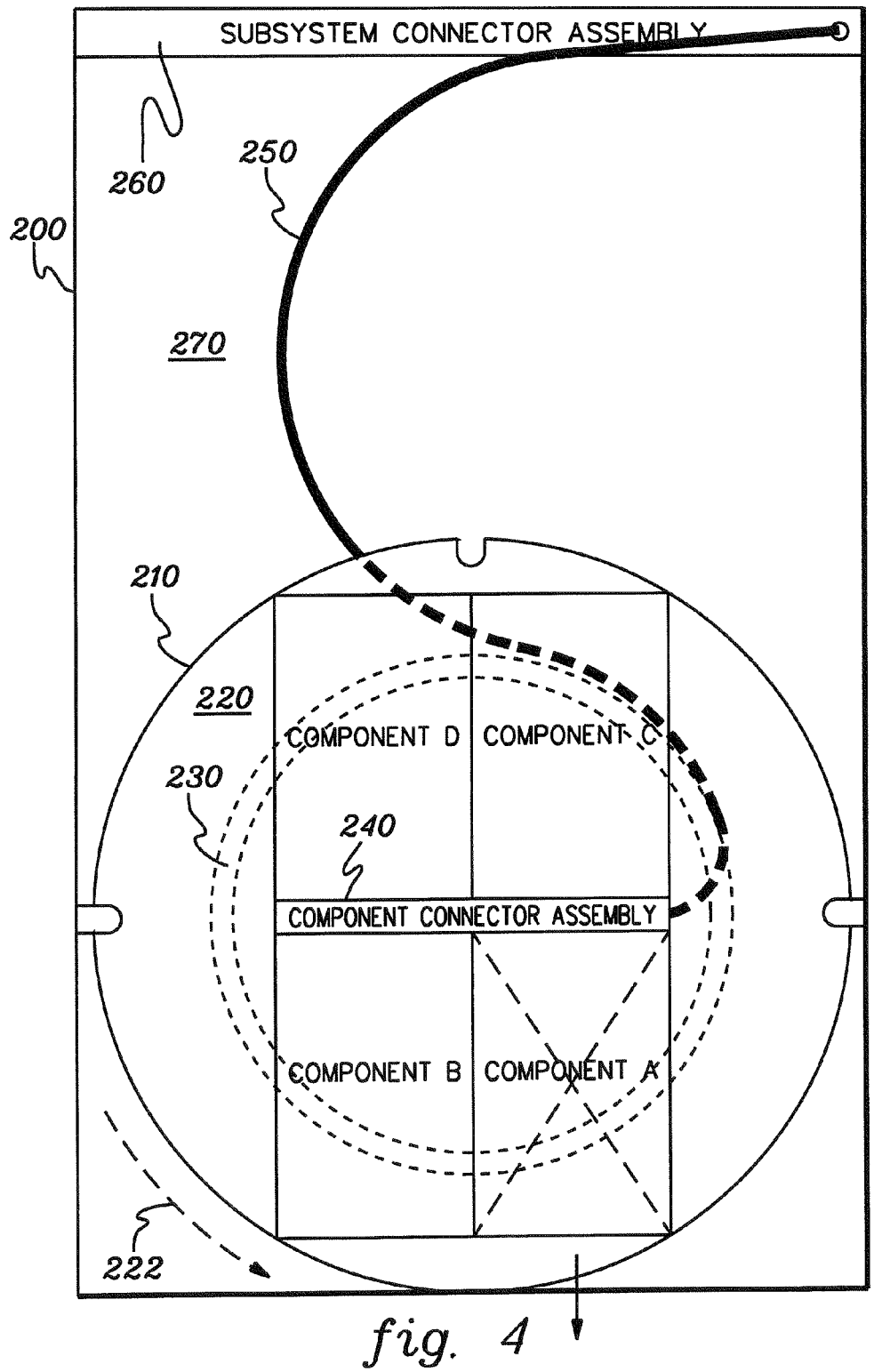
FIG. 4 is a top plan view of the electronics enclosure of FIG. 2 after rotation of the rotatable base support in an opposite direction to allow access through the enclosure's access surface to component A operatively disposed on the rotatable base support, in accordance with an aspect of the present invention.

FIG. 4 depicts electronic subsystem enclosure 200 of FIG. 2, after 90° rotation of rotatable base support 210 in the opposite direction 222 to expose components A & B at the access opening of the front access surface. In this example, it is assumed that an operator removes component A for repair or replacement from electrical and mechanical coupling to component connector assembly 240 disposed on rotatable base member 220. By comparing the orientation of the rotatable base support in FIG. 3 with that in FIG. 4, it will be seen that the one or more flexible cables 250 coupling component connector assembly 240 to the subsystem connector assembly 260 move within the electronic subsystem enclosure 200 with rotation of the rotatable base support. As shown in FIG. 3, additional length of the one ore more flexible cables 250 wraps around rotation support mechanism 230 coupling base member 220 to the electronic subsystem enclosure. In comparison, rotation of the rotatable base support 210 in the opposite direction results in the one or more flexible cables 250 flexing or coiling into space 270 of electronic subsystem enclosure 200.

Figure 5:
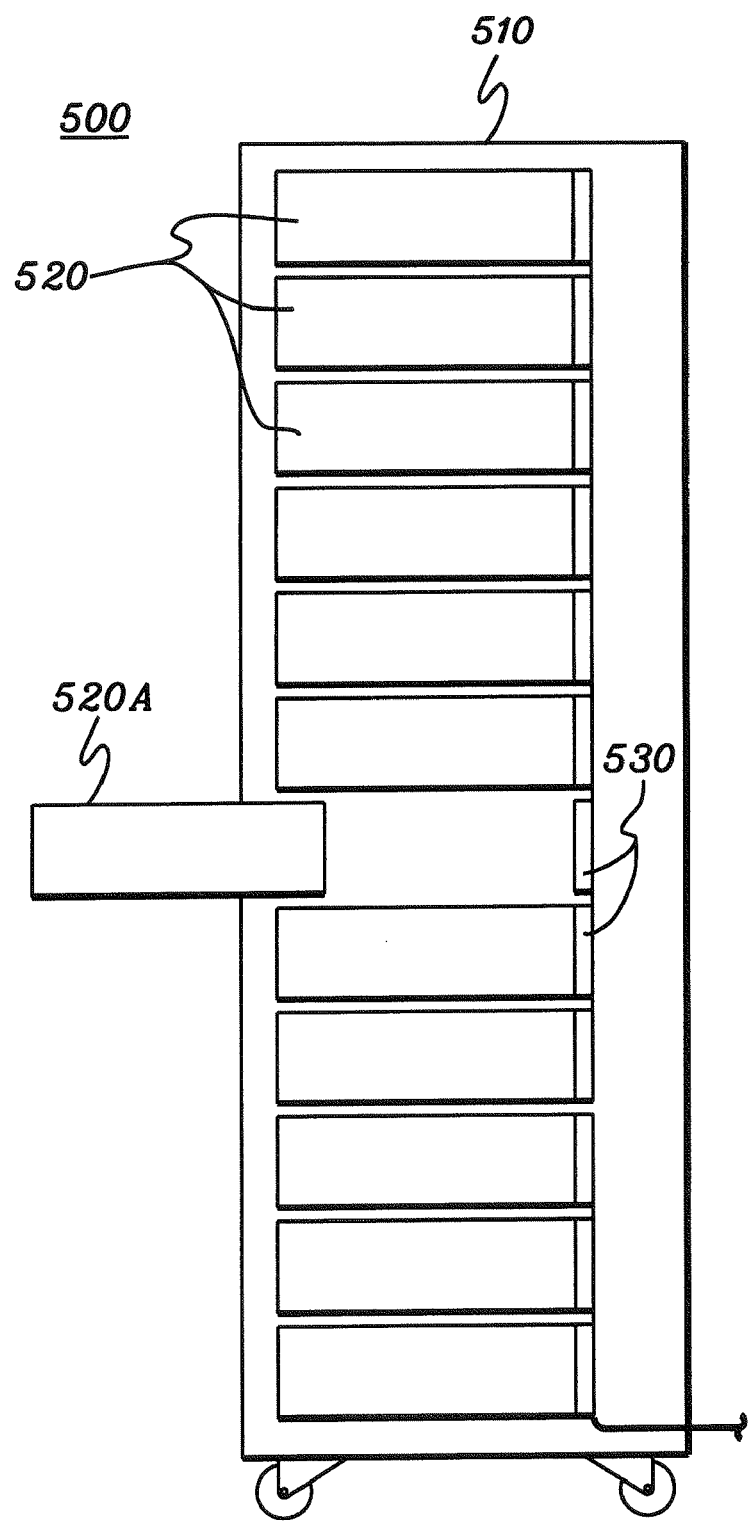
FIG. 5 is a side elevational view of one embodiment of a multi-drawer electronics rack to employ a component support assembly, in accordance with an aspect of the present invention.
Figure 6:
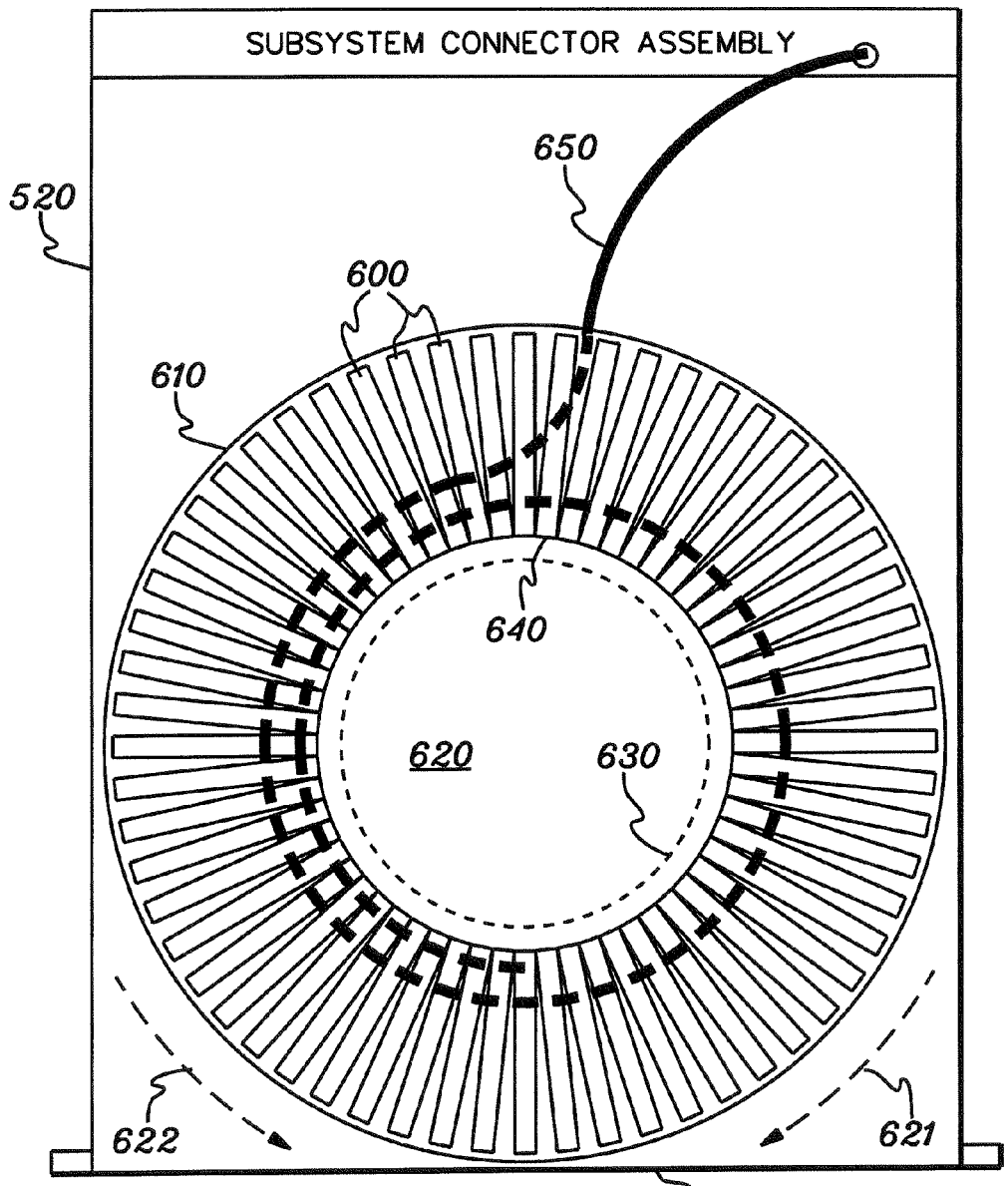
FIG. 6 is a top plan view of an alternate embodiment of a component support assembly within an electronics enclosure, in accordance with an aspect of the present invention.
Figure 6A:
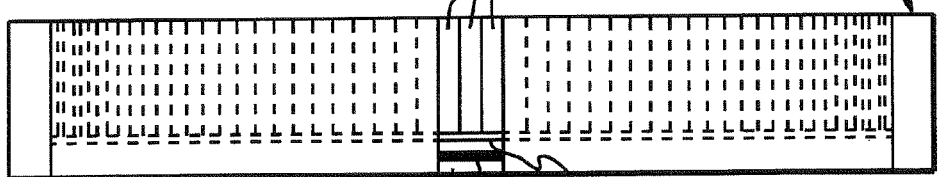
FIG. 6A is a front elevational view of an access surface of the electronics enclosure of FIG. 6, in accordance with an aspect of the present invention.

By way of further example, FIGS. 5-6A depict various aspects of the present invention with reference to an electronics rack, generally denoted 500. Electronics rack 500 includes an electronics housing 510 having a plurality of electronics drawers 520, each of which is an example of an electronics subsystem enclosure, one or more of which employs a component support assembly as described herein. The electronics drawers 520 electrically and mechanically dock with an electronics interface backplane 530 within electronics rack 510. Electronics drawer 520A is shown undocked, for example, for servicing. As noted above, the component support assemblies presented herein provide access to components within the electronics drawer without requiring undocking of the electronics drawer from the electronics rack. By way of specific example, various rack-mounted computer systems are marketed by International Business Machines Corporation of Armonk, N.Y., including various rack-mounted IBM eServers pSeries® systems.

FIG. 6 is a plan view of one embodiment of an electronics drawer 520 employing another embodiment of a component support assembly, in accordance with an aspect of the present invention. This component support assembly includes a rotatable base support 610 with multiple electronics components 600 disposed thereon, which are accessible through a front access surface 601. As noted above, the multiple electronic components may either be of the same type and size of electronic component and/or any desired mix of types and sizes of electronic components. In this example, electronics components 600 are shown operatively positioned on edge on rotatable base support 610. A curved component connector assembly 640 is provided as an electrical/mechanical interface back plane for operatively receiving each of the electronics components. Rotatable base support 610 includes a base member 620 configured as a circular support disk or plate, and a rotation support mechanism 630 disposed thereunder. Rotation support mechanism 630 couples base member 620 to electronics drawer 520 and allows rotation of the base member relative to the electronics drawer. As one example, the rotation support mechanism 630 is a donut-shaped bearing structure (wherein multiple bearings reside within donut-shaped upper and lower tracks), and allows for rotation of the rotatable base support in either direction 621 or 622 at least 180°. One or more flexible cables 650 couple component connector assembly 640 to a subsystem connector assembly. In this example, the one or more flexible cables 650 wind around the rotation support mechanism 630 under base member 620 between the base member and a bottom surface of electronics drawer 520.

FIG. 6A depicts an elevational view of front access surface 601 of the electronics drawer 520. In one example, access opening 602 is a stationary opening in the front access surface 601, or alternatively is a slideable opening to further facilitate selective removal of the one or more electronics components operatively disposed on the rotatable base support. A portion of cable 650 is exposed in the access opening beneath rotatable base support 610.

Figure 7:
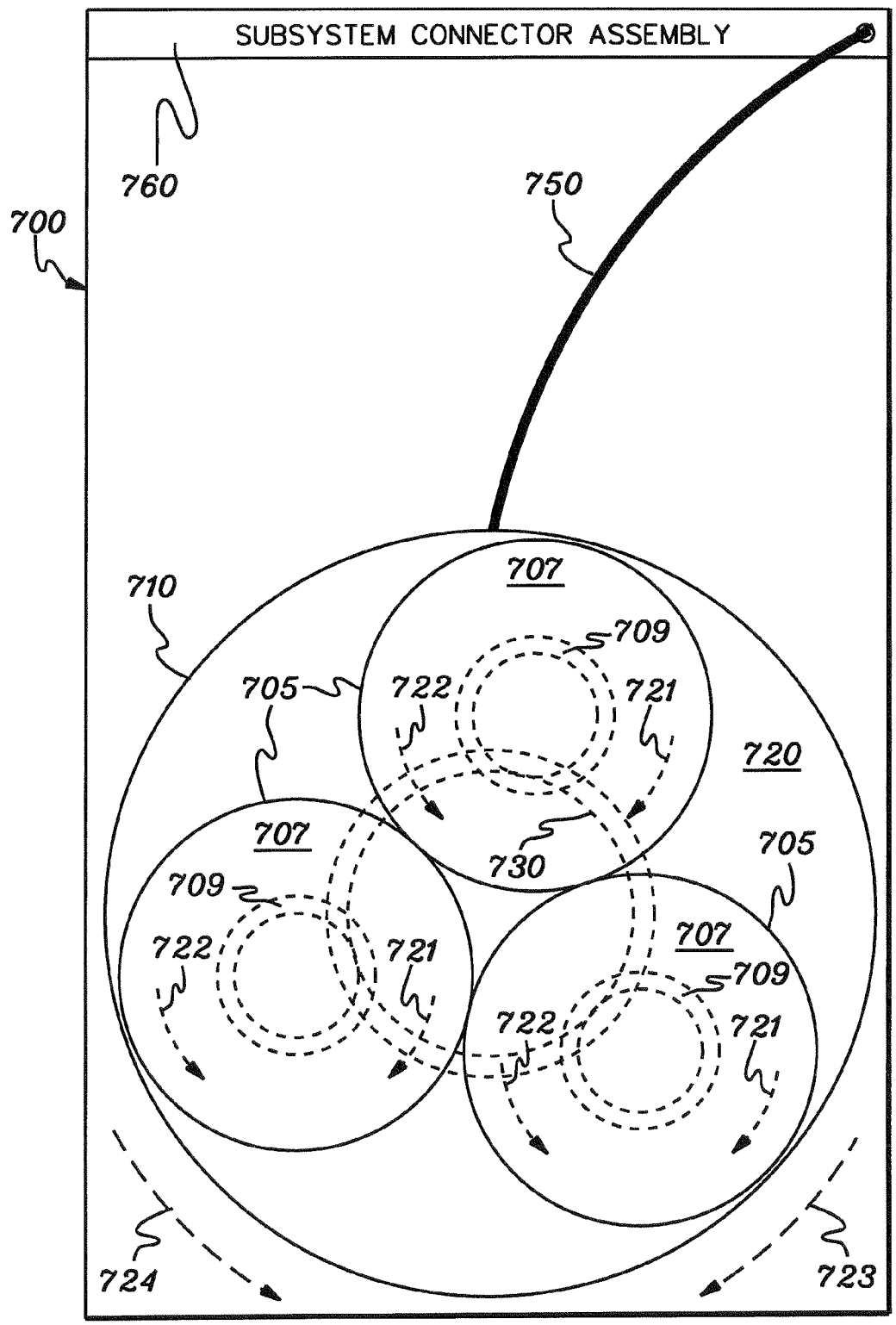
FIG. 7 is a top plan view of another embodiment of a component support assembly within an electronics enclosure, in accordance with an aspect of the present invention.

FIG. 7 depicts still another embodiment of a component support assembly, in accordance with aspects of the present invention. This assembly is shown within an electronics subsystem enclosure 700, which again, might comprise an electronics blade or drawer as described above. In this embodiment, the electronics component assembly includes a first rotatable base support 710 and multiple additional or second rotatable base supports 705 disposed thereon. Each additional rotatable base support 705 is independently rotatable in a first direction 721 and a second direction 722 relative to first rotatable base support 710, which itself is rotatable in a first direction 723 and a second direction 724 relative to electronics subsystem enclosure 700. By way of example, each rotatable base support 705 comprises a base member 707 for supporting multiple electronics components (not shown) thereon, and a rotation support mechanism 709 such as described above in connection with the embodiments of FIGS. 2-6A. Any desired mix of electronics components may be supported by the first rotatable base support 710 and one or more additional rotatable base supports 705. For example, different types and sizes of electronics components may be supported by first rotatable base support 710, with additional rotatable base supports 705 supporting further electronics components of the same type and size, or a mixture of different types and sizes of electronics components. Further, rotatable base support 710 comprises a base member 720 for supporting the multiple additional rotatable base supports 705 (and one or more electronics components if desired). Base member 720 is rotatably coupled to electronics subsystem enclosure 700 via a rotation support mechanism 730 disposed between the base member 720 and a surface of electronics subsystem enclosure 700.

Rotatable base supports 705 further include an appropriate electronics interface such as a component connector assembly described above in connection with the embodiments of FIGS. 2-6A. Similarly, if first rotational base support 710 supports one or more electronics components, then a component connector assembly may also be provided thereon. In the embodiment of FIG. 7, all electronics components may reside on one of the additional rotatable base supports 705, by way of example. Further, one skilled in the art will note that in this example the diameters of the additional rotatable base supports are selected to be non-overlapping and within the extent of the diameter of the first rotatable base support 710 when disposed thereon. Further, one skilled in the art should note that further nesting of rotatable base supports could be achieved by providing further appropriately sized rotatable base supports on one or more of the rotatable base supports 705, etc. Additionally, one skilled in the art should note that the diameters of the additional rotatable base supports 705 may vary as need for a particular application. One or more flexible cables 750 electrically couple the component connector assemblies of the respective additional rotatable base supports 705 (and, if present, the component connector assembly for rotatable base support 710) to the subsystem connector assembly 760 employed as the electrical interface between the electronics subsystem enclosure and an electronics housing (not shown).

By way of further description, the component support assemblies described above in connection with FIGS. 2-7 are employed in connection with an electronics enclosure, such as an electronics subsystem enclosure for a blade system or an electronics rack. The electronics components mounted on the component support assembly become fully functional once the electronics subsystem enclosure is electro-mechanically docked into the associated electronics housing. Should one of the electronics components subsequently fail, a front access cover of the electronics subsystem enclosure is removed and the rotatable base support is rotated until the failed electronics component is accessible and able to be removed. Depending upon the implementation, this may mean rotating the rotatable base support $+/-90°$ to $180°$ or more. The remaining electronics components remain operational while the failed component is replaced. The rotatable base support is then rotated back to a normal or neutral position, and the access cover is re-installed. Again, the flexible cable has sufficient length to allow the necessary rotatable base support rotation, while remaining attached and functional. This extra cable length can be partially coiled in the space between the rotatable base support and the electronics subsystem enclosure around the rotation support mechanism.

Those skilled in the art will note from the above description that provided herein is an electronics component support assembly which allows for improved accessible component density within an electronics enclosure. Although aspects of the present invention are described herein with reference to one or more examples, these are only examples. Many variations are possible without departing from the spirit of the present invention. For instance, environments other than the multi-blade system and rack-mounted system described herein may employ and benefit from one or more aspects of the present invention. Further, the electronics components may either be of the same type and size, or of any desired mix of different types and sizes of electronics components and still benefit from the modularity aspects of the present invention.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of facilitating access to electronics components within an electronics enclosure, the method comprising:
   providing a component support assembly comprising a rotatable base support, and a component connector assembly associated with the rotatable base support for operatively coupling to multiple electronics components, wherein the rotatable base support is sized to reside within the electronics enclosure and support multiple operational electronics components thereon;
   disposing multiple electronics components on the rotatable base support in operative position by coupling the multiple electronics components to the component connector assembly; and
   wherein rotation of the rotatable base support facilitates access to the multiple electronics components during operation of the multiple electronics components, and wherein the component connector assembly allows for rotation of the rotatable base support with the multiple electronics components operatively supported thereon.

2. The method of claim 1, further comprising providing at least one flexible cable connecting the component connector assembly to an electronics interface of the electronics enclosure, wherein the providing of the at least one flexible cable comprises providing the at least one flexible cable with sufficient length and flexibility to allow for rotation of the rotatable base support at least 90°.

3. The method of claim 2, further comprising providing an access opening within an access surface of the electronics enclosure, wherein the access opening allows access therethrough to the multiple electronics components supported by the rotatable base support via selective rotation of the rotatable base support.

4. The method of claim 1, wherein the disposing comprises placing the multiple electronics components in a planar array on the rotatable base support.

5. The method of claim 1, wherein the disposing comprises disposing at least some electronics components of the multiple electronics components vertically in operative position on the rotatable base support and coupled to the component connector assembly.

6. The method of claim 1, wherein the rotatable base support comprises a first rotatable base support, and wherein the method further comprises providing at least one additional rotatable base support rotatably coupled to the first rotatable base support to rotate relative to the first rotatable base support and turn with rotation of the first rotatable base support, and wherein the at least one additional rotatable base support operatively supports at least one electronics component thereon of the multiple electronics components and facilitates access to the at least one electronics component disposed thereon.

* * * * *